United States Patent
Bilotti et al.

(10) Patent No.: US 6,622,012 B2
(45) Date of Patent: *Sep. 16, 2003

(54) MAGNETIC POLE INSENSITIVE SWITCH CIRCUIT

(75) Inventors: Alberto Bilotti, Florida (AR); Glenn A. Forrest, Nottingham, NH (US); Ravi Vig, Bow, NH (US)

(73) Assignee: Allegro Microsystems, Inc., Worcester, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/997,148

(22) Filed: Nov. 27, 2001

(65) Prior Publication Data

US 2002/0068533 A1 Jun. 6, 2002

Related U.S. Application Data

(63) Continuation of application No. 09/338,668, filed on Jun. 22, 1999, which is a continuation-in-part of application No. 09/156,939, filed on Sep. 18, 1998, now abandoned.

(51) Int. Cl.[7] ................................................. H04B 1/38
(52) U.S. Cl. ..................... 455/90; 455/550; 307/116; 327/511
(58) Field of Search .................... 455/90, 550, 351; 379/420, 433; 307/116; 327/511

(56) References Cited

U.S. PATENT DOCUMENTS

| | | | |
|---|---|---|---|
| 4,204,158 A | 5/1980 | Ricouard et al. | 324/208 |
| 4,349,814 A | 9/1982 | Akehurst | 340/679 |
| 4,355,209 A | 10/1982 | Sabon | 179/18 |
| 4,745,363 A | 5/1988 | Carr et al. | 324/208 |
| 4,761,569 A | 8/1988 | Higgs | 307/309 |
| 4,859,941 A | 8/1989 | Higgs et al. | 324/208 |
| 4,966,041 A | 10/1990 | Miyazaki | 73/862.33 |
| 5,541,562 A | 7/1996 | Fletcher et al. | 335/205 |
| 5,666,410 A | 9/1997 | McLane | 379/452 |
| 5,686,894 A | 11/1997 | Vig et al. | 340/618 |
| 5,789,915 A | 8/1998 | Ingraham | 324/207.2 |
| 5,861,796 A | 1/1999 | Benshoff | 338/32 |
| 5,867,021 A | 2/1999 | Hancock | 324/207.2 |
| 6,014,008 A | 1/2000 | Hartzell et al. | 320/106 |
| 6,035,211 A | 3/2000 | Rabe et al. | 455/550 |

FOREIGN PATENT DOCUMENTS

| | | |
|---|---|---|
| EP | 0631416 | 12/1994 |
| JP | 62048160 | 3/1987 |

*Primary Examiner*—Lee Nguyen
(74) *Attorney, Agent, or Firm*—Daly, Crowley & Mofford, LLP

(57) ABSTRACT

A switch which is magnetic pole insensitive is described. The switch includes a Hall effect sensor coupled to a threshold circuit which provides an output signal indicative of the proximity of a magnet, and hence a magnetic field, to the Hall effect sensor regardless of the orientation of the magnet to the Hall effect sensor.

13 Claims, 7 Drawing Sheets

SWITCH OUTPUT SIGNAL
(TO CONTROL CIRCUIT)

MAGNETIC POLE INSENSITIVE SWITCH CIRCUIT

CROSS REFERENCE TO RELATED APPLICATION

This application is a continuation of U.S. patent application Ser. No. 09/338,668, entitled MAGNETIC POLE INSENSITIVE SWITCH CIRCUIT, filed on Jun. 22, 1999 which is a continuation-in-part application of U.S. patent application Ser. No. 09/156,939, entitled MAGNETIC POLE INSENSITIVE SWITCH CIRCUIT, filed on Sep. 18, 1998 now abandoned.

STATEMENT REGARDING FEDERALLY SPONSORED RESEARCH

Not Applicable.

FIELD OF THE INVENTION

The present invention relates to switches and more particularly to switches which are responsive to magnet fields.

BACKGROUND OF THE INVENTION

As is known in the art, there exists a relatively large number of commercially available devices having a base or stationary portion and a movable cover or door portion which include a magnet. For example, telephones, cellular telephones, notebook or laptop computers and refrigerators include magnets in the moveable door or cover portions. The covers are typically opened and closed and, in some cases, the magnets provide a magnetic force which maintains the cover or door in a particular position (e.g. a closed position).

Such devices can also include detectors or sensors which indicate when a door or cover is in an open or a closed position. For example, cellular telephones (cell phones) which are provided as so-called "flip phones," include a base and a cover or "flip" portion. The cover has a magnet disposed therein. Disposed in the base portion of the cell phone is a sensor. When the cover is closed, the magnet is disposed over the sensor and the sensor detects the presence of the magnet's magnetic field. In response to the magnetic field, the sensor provides a signal which indicates that the cover is closed. Similarly, when the cover is open, the magnet (and hence the magnetic field) is removed from the sensor and the sensor provides a signal indicating that the cover is open.

In some applications, the sensor is provided as a Reed switch. The Reed switch is a mechanical type switch comprised of an evacuated glass tube having a series of metal fingers disposed therein. In response to the presence a magnetic field, the metal fingers are in mechanical contact thus providing a signal path having a short circuit impedance characteristic between the input and output terminals of the switch. Likewise, in the absence of a magnetic field, the mechanical fingers are not in contact thus providing a signal path having an open circuit impedance characteristic between the input and output terminals of the switch.

Reed switches have the advantage that the switch operates regardless of the orientation of the magnet with respect to the switch. That is the Reed switch need not be oriented in a particular manner with respect to the poles of the magnet. This allows for easy replacement of the magnet or the Reed switch since there is not physical relationship between them.

One problem with the Reed switch approach, however, is that the Reed switch is relatively large and expensive when compared with semi-conductor type switches. Also, the Reed switch is a mechanical type switch and thus is not as reliable as a solid state devices.

SUMMARY OF THE INVENTION

In view of the above problems with the prior art approach it has, in accordance with the present invention, been recognized that it would be desirable to provide a replacement for mechanical type switches such as Reed switches One problem with using a semiconductor switch in place of the Reed switch, however is that semiconductor devices, which include elements such as a Hall element, must be aligned in a particular manner with respect to the north and south poles of the magnet. If the magnet and Hall element are not properly oriented (i.e. the appropriate ends of the hall element are not aligned with the appropriate magnetic poles) then the semiconductor switch will not operate correctly. This leads to difficulties when it becomes necessary to replace the magnet or the semiconductor switch. For example, if a magnet must be replaced and neither the magnet nor the Hall element or switch are somehow coded so that it is known which end of the magnet to place at which end of the Hall element, then it is necessary to proceed by trial and error to determine how to install the replacement parts.

It would, therefore, be desirable to provide a reliable magnetic pole insensitive switch which can serve as a "drop-in" replacement for mechanical type switches such as Reed switches.

It would also be desirable to use a semiconductor switch including a Hall effect element as a drop in replacement for a Reed switch type device, however this requires the Hall element to be insensitive as to whether a north pole or south pole is being sensed.

In accordance with the present invention, a sensor for sensing an article which provides a magnetic field includes a magnetic-field-to-voltage transducer for generating at an output thereof a first signal voltage having a signal voltage level which is proportional to a magnetic field having a first polarity and a second signal voltage having a signal voltage level that is proportional to a magnetic field having a second different polarity and a window comparator having an input port coupled to the output port of the magnetic-field-to-voltage transducer to receive the first and second signal voltages and to provide an output signal having a first value when the article is within a first predetermined distance of the magnetic-field-to-voltage transducer regardless of the polarity of the magnetic field. With this particular arrangement, a drop in replacement for a Reed switch type device which is insensitive as to whether a north pole or south pole is being sensed is provided. By providing the comparator as a window or symmetrical comparator (i.e., a comparator having the same switching point for positive and negative magnetic fields) the sensor operates correctly regardless of the orientation of the magnet relative to the magnetic-field-to-voltage trans ducer.

In accordance with a further aspect of the present invention, a switch includes a Hall element and a threshold detector circuit having a substantially similar switching point for positive and negative magnetic fields. With this particular arrangement, a switch which utilizes a Hall effect device can operate correctly regardless of the orientation of the magnetic poles with respect to the Hall device. In one embodiment, the threshold circuit is provided as a comparator circuit.

BRIEF DESCRIPTION OF THE DRAWINGS

The foregoing features of this invention as well as the invention itself may be more fully understood from the following detailed description of the drawings, in which.

DETAILED DESCRIPTION OF THE INVENTION

The following description sets forth an exemplary embodiment in which the present invention may be used. Specifically, certain reference is made below to a cellular telephone (cell phone) application. It should be understood, however, that the present invention finds use in a wide variety of applications and devices and is not limited to the exemplary embodiment described below. For example, the invention may be used in any device or apparatus which uses a magnetic device in conjunction with a movable portion such as a movable cover or door including cellular and non-cellular telephones, notebook or laptop computers and refrigerators.

Figure 1:
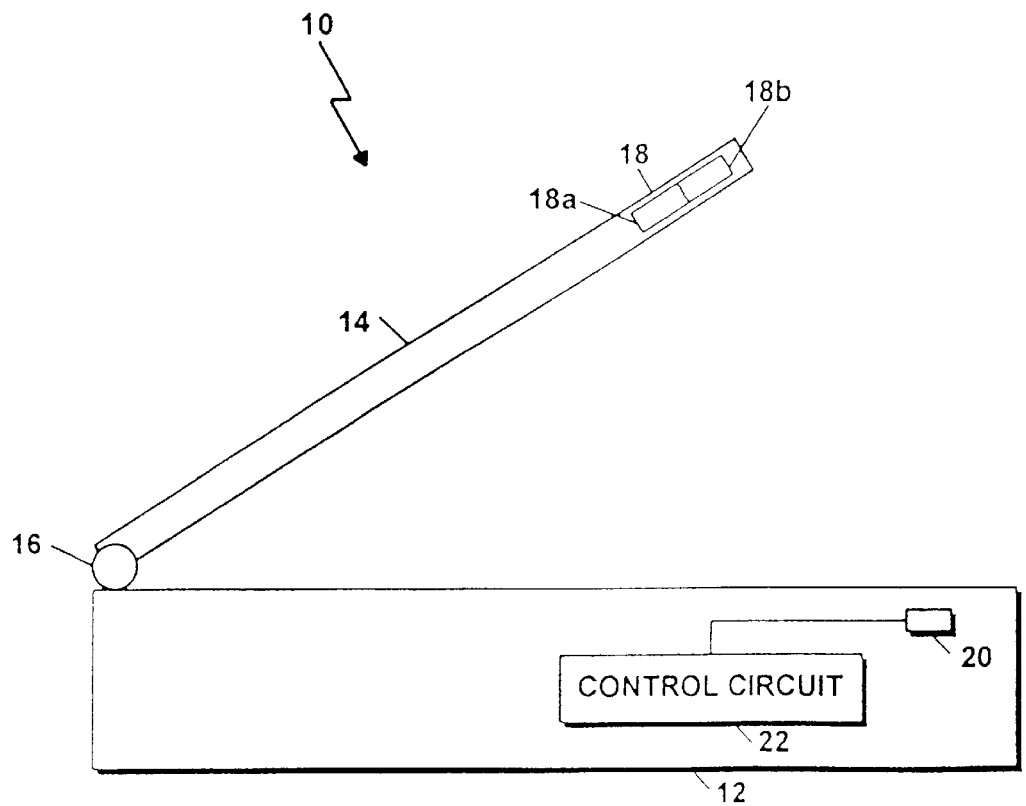
FIG. 1 is a block diagram of a cellular telephone including a magnetic pole insensitive switch in accordance with the present invention.

Referring now to FIG. 1, a cellular telephone (cell phone) 10 includes a base portion 12 having a first end of a cover 14 movably coupled thereto. In this particular example, the first end of the cover 14 is movably coupled to the base 12 through a rotatable joint 16. Those of ordinary skill in the art will recognize of course that any coupling device or means which allows the cover 14 to move with respect to base 12 maybe used in place of rotatable joint 16.

Disposed in the second end of the cover 14 is a magnetic article 18 such as a magnet. The magnet 18 has a first pole 18a and a second pole 18b. Depending upon how the magnet 18 is disposed in the cover 14 the first pole 18a may correspond to a north or south pole of the magnet and the second pole 18b will correspond to the other pole of the magnet.

Disposed in the base 12 is a semiconductor switch 20 which operates regardless of the orientation of the magnetic poles of magnet 18. One possible embodiment of the switch is described in detail below in conjunction with FIGS. 2–5. Suffice it here to say that switch 20 includes a sensor for sensing the magnetic field of the magnet 18 and a threshold detection circuit or comparator.

The transducer provides a transducer output signal having a signal level which varies depending upon the orientation of the magnet 18 to the sensor. Thus, the transducer generates a first signal voltage having a signal voltage level which is proportional to a magnetic field having a first polarity and a second opposite signal voltage having an opposite signal voltage level that is proportional to a magnetic field having a second different polarity. In one embodiment, the transducer may be provided as a magnetic-field-to-voltage transducer.

Switch 20 also includes a comparator coupled to the transducer to receive the first and second signal voltages and to provide an output signal having a first value when the article is within a first predetermined distance of the magnetic-field-to-voltage transducer regardless of the polarity of the magnetic field. Thus, when the cover 14 is open the magnet 18 is displaced from the switch 20 and the switch 20 provides a switch signal having a first predetermined signal level regardless of the orientation of the magnet 18 with respect to the switch 20. Similarly, when the cover 14 is closed the magnet is proximate the switch 20 and the switch 20 provides a switch signal having a second predetermined signal level regardless of the orientation of the magnet 18 with respect to the switch 20.

The signal provided by switch 20 merely indicates whether the cover 14 is open opened or closed. Thus, when the cover is closed, the switch provides a first signal having a first value and when the cover 14 is open, the switch 20 provides a second signal having a second different value.

The signals provided by the switch 20 are coupled to a control circuit 22. The control circuit 22 implements, or causes to be implemented, certain functions depending upon the position of the cover 14 (i.e. depending upon whether the cover 14 is open or closed). For, example, when the cover is closed, switch 20 provides a signal to control circuit 22 so indicating and control circuit 22 may cause cell phone 10 to operate in a power saver mode.

Figure 2:
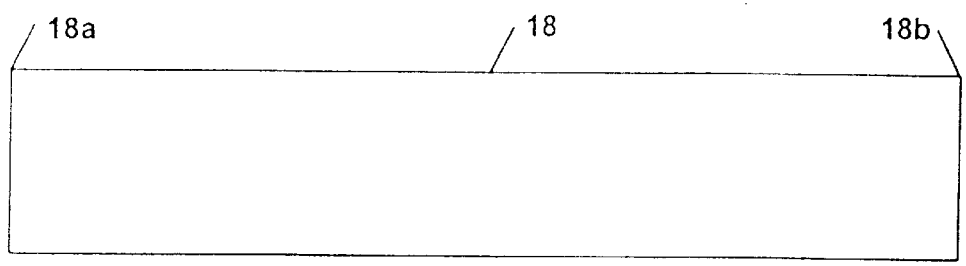
FIG. 2 is a block diagram of a magnetic pole insensitive switch.
Figure 2:
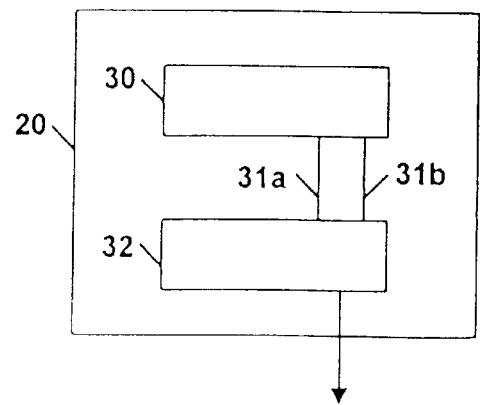

Referring now to FIG. 2, the switch 20 is shown to include a Hall effect device 30 coupled to a comparator 32. In accordance with the present invention, the Hall effect device 30 functions with the comparator 32 to provide proper operation regardless of the orientation of the magnet 18 with respect to the Hall effect device 30.

The Hall effect device 30 acts as a magnetic-field-to-voltage transducer which generates at output terminals 31a, 31b a first signal voltage having a first signal level voltage which is proportional to a magnetic field having a first polarity and a second signal voltage having a second signal voltage level that is proportional to a magnetic field having a second different polarity. The comparator 32 receives the signals on terminals 31a, 31b.

It will be appreciated by those of ordinary skill in the art that other magnetic-field-to-voltage transducers may be used. As one example, the Hall effect device 30 may be replaced with a magneto-resistive bridge, including a magneto-resistive element and a bridge configuration, such as a Wheatstone bridge. The magneto-resistive element is a resistive device, such as a metallic thin film resistor, having a resistance that changes depending on the angle between the flux and the device. More particularly, the magneto-resistive element senses flux parallel to the plane of the device and normal to current flow.

The comparator 32 provides an output signal having a first value when the magnet 18 is within a first predetermined distance of the transducer 30 regardless of the polarity of the magnet 18. The comparator 32 provides an output signal having a second different value when the magnet 18 is not within the first predetermined distance of the transducer 30 regardless of the polarity of the magnet 18 Thus, regardless of whether the second end 18b of magnet 18 is a north or a south pole, the switch 20 provides a signal indicating whether the magnet 18 is proximate the sensor 14. Thus, the switch 20 provides, for example, an indication of whether the cover 14 (FIG. 1) is opened or closed.

Figure 3:
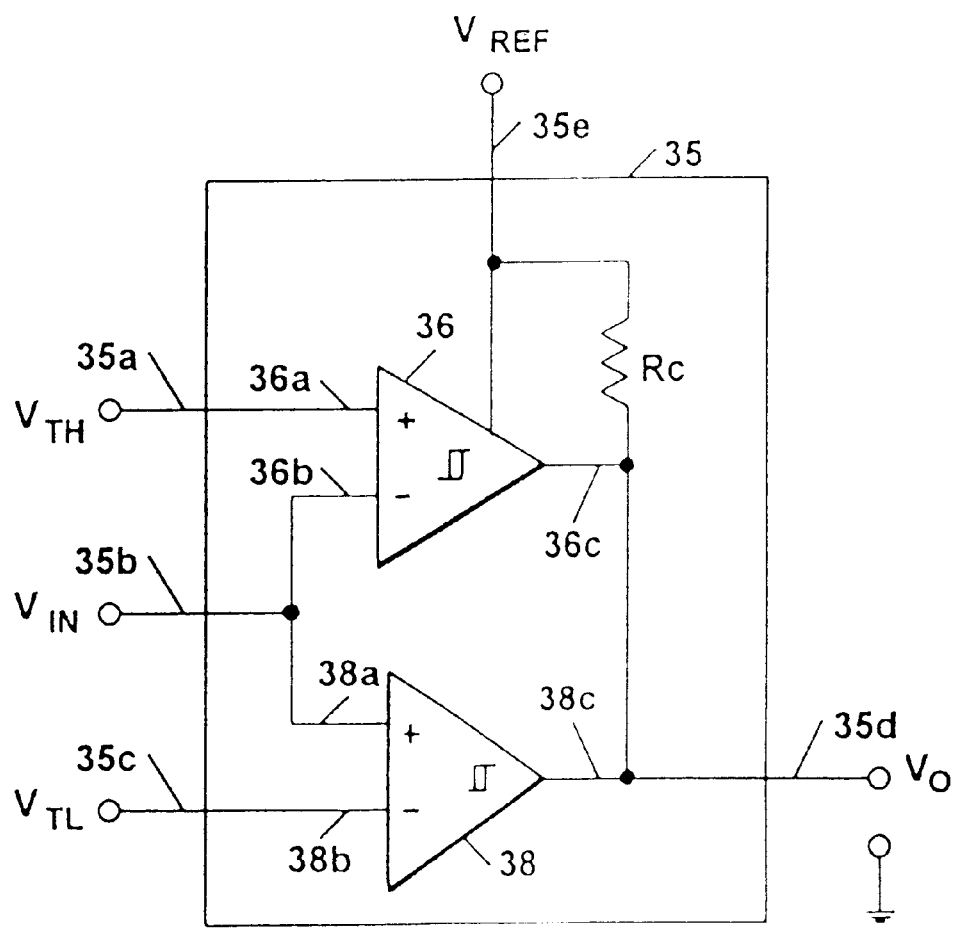
FIG. 3 is a schematic diagram of a comparator.

Referring now to FIG. 3, a comparator circuit 35 has a plurality of terminals, 35a–35e, and includes first and second and comparators 36, 38. The comparator 36 has a first terminal 36a coupled to a first reference voltage $V_{TH}$ at terminal 35a, a second input terminal 36b coupled to an input voltage $V_{IN}$ at terminal 35b and an output terminal 36c coupled to comparator circuit output terminal 35d where an output voltage $V_{OUT}$ is provided. A reference voltage, $V_{REF}$ is coupled to terminal 35e and provides a reference voltage to comparators 36, 38.

The comparator 38 includes a first input terminal 38a coupled at input port 35b to the input voltage $V_{IN}$ and a second input terminal, 38b, coupled to a threshold voltage $V_{TL}$ at terminal 35c. An output terminal 38c of comparator 38 is coupled to provide the output voltage $V_{OUT}$ at the output terminal 35d.

Figure 3A:
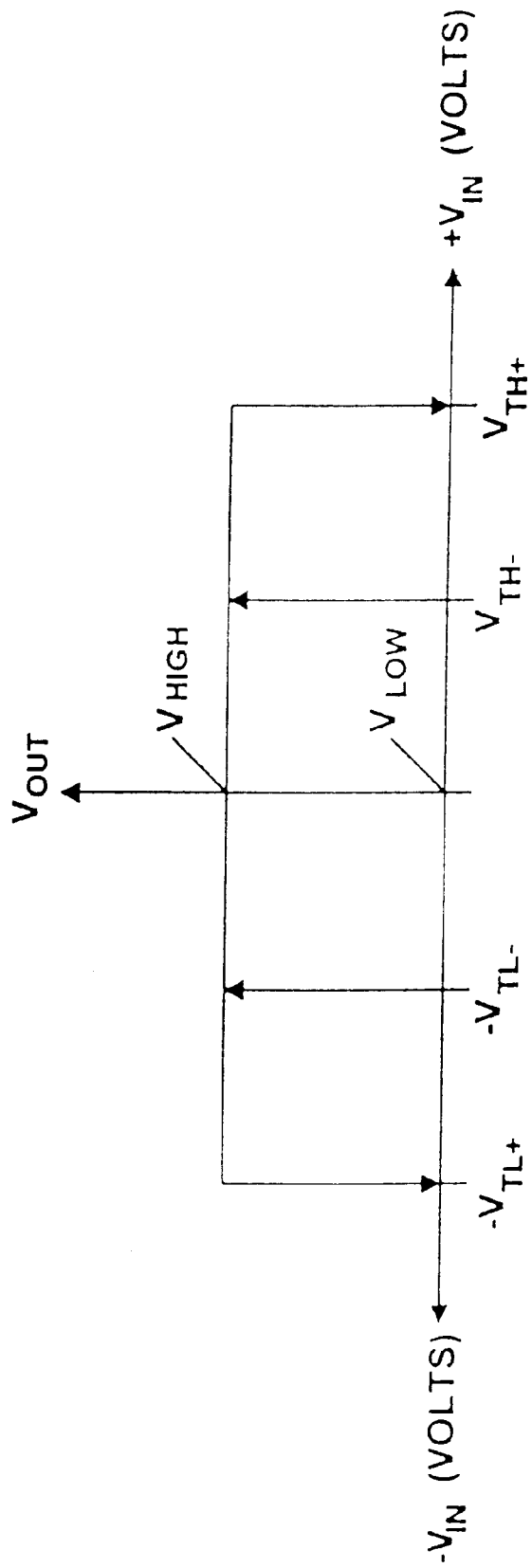
FIG. 3A is a plot of window comparator input voltage versus output voltage.

In this particular embodiment, comparators 36, 38 are provided having a means for including hysteresis such that the reference or threshold voltages $V_{TH}$, $V_{TL}$ can be represented as $V_{TH+}$ and $V_{TH-}$ and $V_{TL+}$ and $V_{TL-}$, respectively. The values $V_{TH+}$, $V_{TH-}$, $V_{TL+}$, $V_{TL-}$ represent the comparator switch points depending upon the value of the output voltage $V_{OUT}$. As indicated in FIG. 3A, once the output voltage $V_{OUT}$ switches (e.g. from a high level to a low level), then the switch point changes from $V_{TH+}$ to $V_{TH-}$. Likewise, once the output voltage $V_{OUT}$ switches from a low level to a high level, then the switch point changes from $V_{TH-}$ to $V_{TH+}$ As can be seen in FIG. 3A, the same holds true as the input voltage $V_{IN}$ assumes negative voltages (i.e. voltage values on the left hand side of the Y-axis in FIG. 3A) That is, once the output voltage $V_{OUT}$ switches then the switch point changes from $-V_{TL+}$ to $-V_{TL-}$ and vice-versa depending upon whether the output is switching from low to high or from high to low.

If the output voltage $V_{OUT}$ is high and the input voltage $V_{IN}$ has a value greater than or equal to zero, when the input voltage $V_{IN}$ meets or exceeds the voltage $V_{TH+}$, the output voltage switches from a value of $V_{HIGH}$ to $V_{LOW}$ and the switch point changes from $V_{TH+}$ to $V_{TH-}$. Thus the value of the output voltage $V_{OUT}$ will not switch from $V_{LOW}$ to $V_{HIGH}$ until the input voltage $V_{IN}$ reaches the value $V_{TH-}$.

It should be appreciated that in other embodiments and applications it may be preferable to utilize comparators which do not have hysteresis and thus switching occurs at a single voltage level, namely $V_{TH}$.

In operation, and with reference now to FIG. 3A, the input voltage $V_{IN}$ is generated in response to a magnetic field being provided to and removed from a magnetic field sensing device which senses the magnetic field and provides a corresponding signal in response thereto. As discussed above in conjunction with FIG. 1, such a magnetic field could be provided from the opening and closing of a cover having a magnetic article provided therein.

If the magnetic field sensing circuit is provided as a Hall device, a signal voltage is provided. Assuming the input voltage $V_{IN}$ is at or near zero volts (i.e. $V_{IN}$=0 volts), the output voltage $V_{OUT}$ is at a first predetermined voltage level $V_{HIGH}$ which may correspond for example to a so-called transistor-transistor-logic (TTL) high voltage level. In response to a magnetic field, the Hall device provides either a positive or a negative input voltage $V_{IN}$. If the input voltage provided by the Hall device moves in a positive direction from zero volts toward the threshold voltage, $V_{TH+}$, when the threshold voltage meets and/or exceeds the threshold voltage level $V_{TH+}$, then the output voltage $V_{OUT}$ changes from the predetermined signal level, $V_{HIGH}$ to a second predetermined voltage level $V_{LOW}$ which may correspond for example to a so-called TTL low voltage level. When the input voltage moves past the threshold voltage $V_{TH-}$ in a negative-going direction, the output voltage changes from $V_{LOW}$ back to $V_{HIGH}$.

Likewise, as the input voltage moves in a negative direction from zero volts and reaches and/or exceeds the threshold voltage $-V_{TL+}$, the output voltage $V_{OUT}$ changes from the first value $V_{HIGH}$ to the second value $V_{LOW}$. Similarly, as the input voltage $V_{IN}$ moves from $-V_{TL+}$ and reaches and/or exceeds the voltage level $-V_{TL-}$, the voltage level then changes from the output voltage level $V_{LOW}$ to $V_{HIGH}$.

Figure 4:
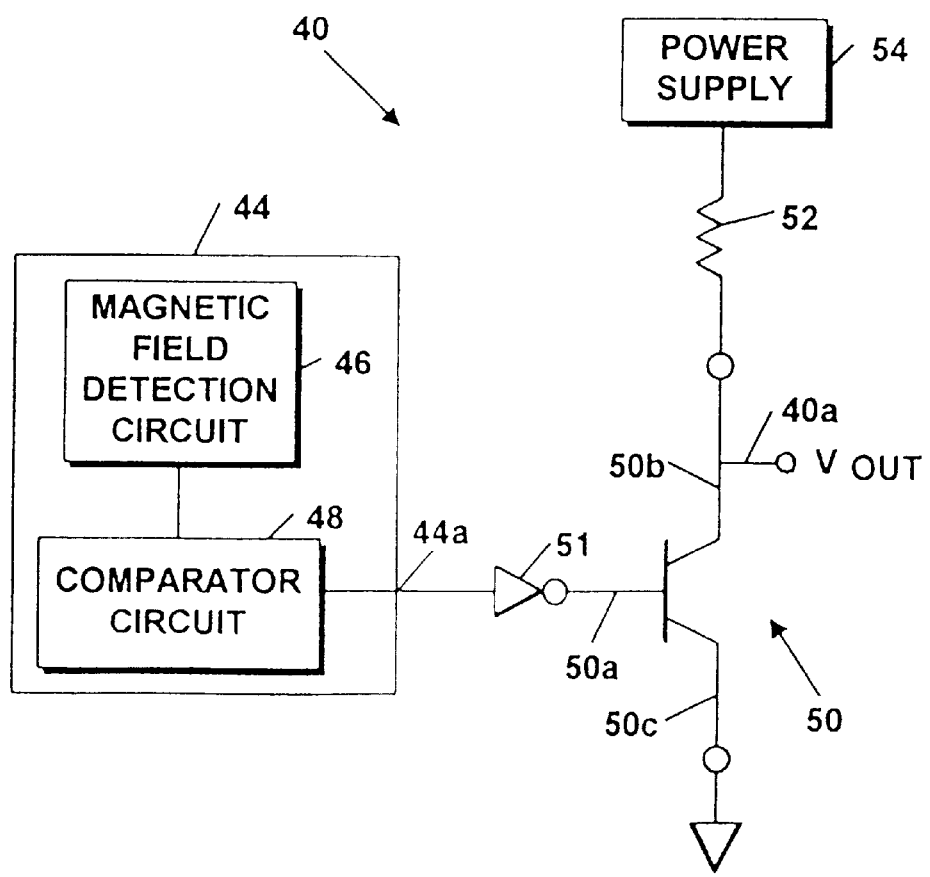
FIG. 4 is a schematic diagram of a switch circuit utilizing a comparator.
Figure 4A:
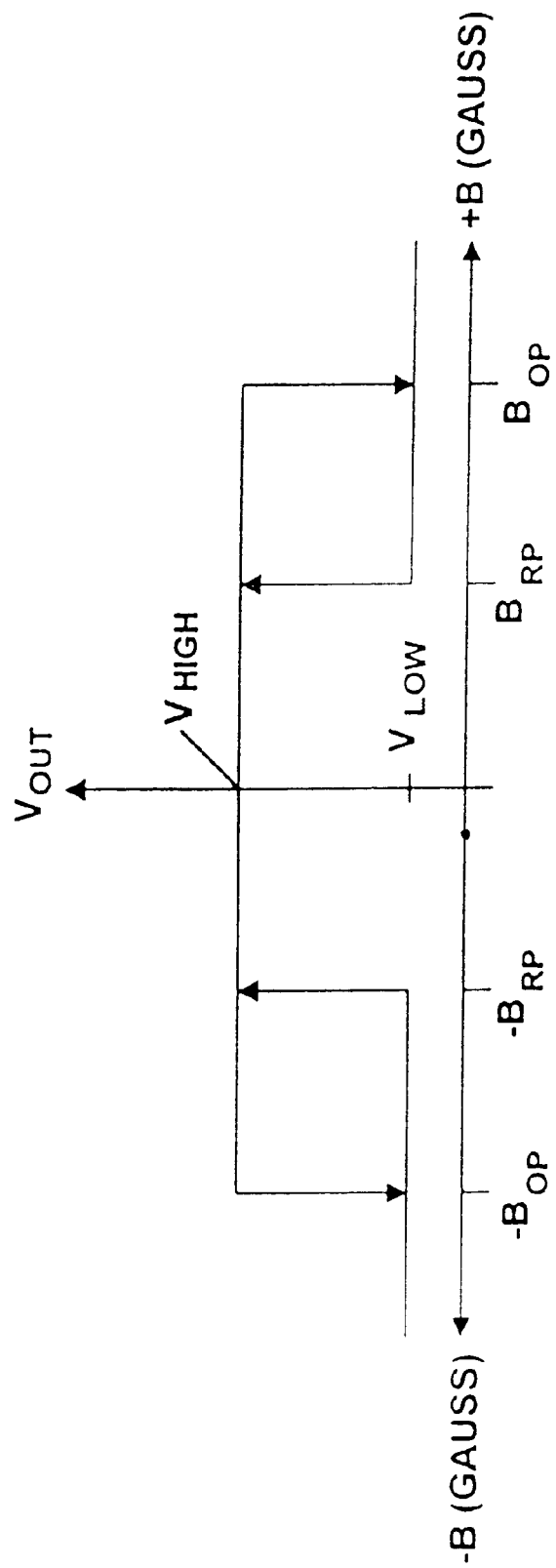
FIG. 4A is a plot of voltage versus magnetic field.

Referring now to FIGS. 4 and 4A, a switching circuit 40 includes a sensing and control circuit 44 which includes a magnetic field detection circuit 46 coupled to a comparator circuit 48. Comparator circuit 48 can include the necessary circuitry (e.g. bias circuits) to provide an appropriate control signal to the control terminal of a switch 50 in response to signals provided from the magnetic field detection circuit 46 In one embodiment, the magnetic field detection circuit may include a Hall element which provides an output voltage signal in response to the presence or absence of a magnetic field. In this particular embodiment, the output of comparator 48 is fed to the switch through an optional inverter circuit 51. Inverter circuit 51 is here included to maintain the consistency between the logic implemented by the circuit of FIG. 4 and the logic implemented by the circuits of FIGS. 3 and 5 in an effort to simplify the corresponding descriptions of each of the figures.

The sensing and control circuit 44 provides a comparator output signal at terminal 44a to a control terminal 50a of a switch circuit 50. In this embodiment, the switch circuit 50 is shown as a transistor switch and in particular is shown as a bi-polar junction transistor (BJT). In this case, the control terminal 50a corresponds to a base terminal of the transistor 50. A second terminal 50b of the transistor 50 is coupled through a resistor 52 to a power supply 54 and to an output terminal 40a. A third transistor terminal 50c is coupled to a first reference potential, here corresponding to ground. It should be noted that although the switch circuit 50 is here shown as a BJT, those of ordinary skill in the art will appreciate that other types of transistors may also be used. For example, in some embodiments, it may be preferable to use a field effect transistor (FET).

Depending upon the proximity of a magnetic article to the magnetic detection circuit, the output signal provided at the output terminal 40a has one of a first and a second voltage level. When the magnetic field detection circuit 46 senses a strong magnetic field (such as would be the case, for example, with the cover 14 in FIG. 1 in the closed position), the comparator 48 provides a first or high signal voltage at control terminal 50a and thus biases the switch circuit 50 into its conductive state. In its conductive state, the switch transistor 50 provides a signal path having a relatively low impedance characteristic between the transistor terminals 50b and 50c and thus causes the output voltage $V_{OUT}$ at the output terminal 40a to be a low voltage.

Similarly, with the cover open, magnetic field detection circuit 46 senses a relatively weak magnetic field and the comparator 48 provides a low signal voltage at the control terminal 50a and thus biases transistor 50 into its non-conductive state. In its non-conductive state, the transistor 50 provides a signal path having a relatively high impedance characteristic between the transistor terminals 50b and 50c and thus causes the output voltage $V_{OUT}$ at output terminal 40a to be a high voltage.

Referring briefly to FIG. 4A, the output voltage $V_{OUT}$ vs. the magnetic field strength B is shown. As can be seen from the plot of FIG. 4A, when the strength of the magnetic field B reaches an operating point level, $B_{OP}$ the output voltage $V_{OUT}$ maintains a low signal level and when the magnetic field level reaches a release point level, $B_{RP}$, the output voltage $V_{OUT}$ reaches a high signal level. It should thus be noted that the sensing and control circuit 42 in combination with transistor 50 provide the appropriate signal levels regardless of whether the magnetic field is a positive field or a negative field (i.e., a north or a south pole). Thus, as shown in Tables I and II below, the switching circuit 40 provides the correct signal to the control circuit 22 (FIG. 1).

TABLE I

| COVER POSITION | COMPARATOR OUTPUT | TRANSISTOR STATE | $V_{OUT}$ |
|---|---|---|---|
| CLOSED | LOW | ON | LOW |
| OPEN | HIGH | OFF | HIGH |

Table I shows that when a magnetic field is detected, the comparator 48 provides a signal which biases the transistor 50 into its conductive state (i.e. the transistor is ON). This results in the signal level of the signal $V_{OUT}$ being low. Similarly, when no magnetic field is detected, the comparator 48 provides a signal which biases the transistor 50 into its non-conductive state (i.e. the transistor is OFF). This results in the signal level of the signal $V_{OUT}$ being high. It should be noted that column of Table I labeled "Comparator Output" refers to the output of the comparator 48 prior to the inverter circuit.

Figure 5:
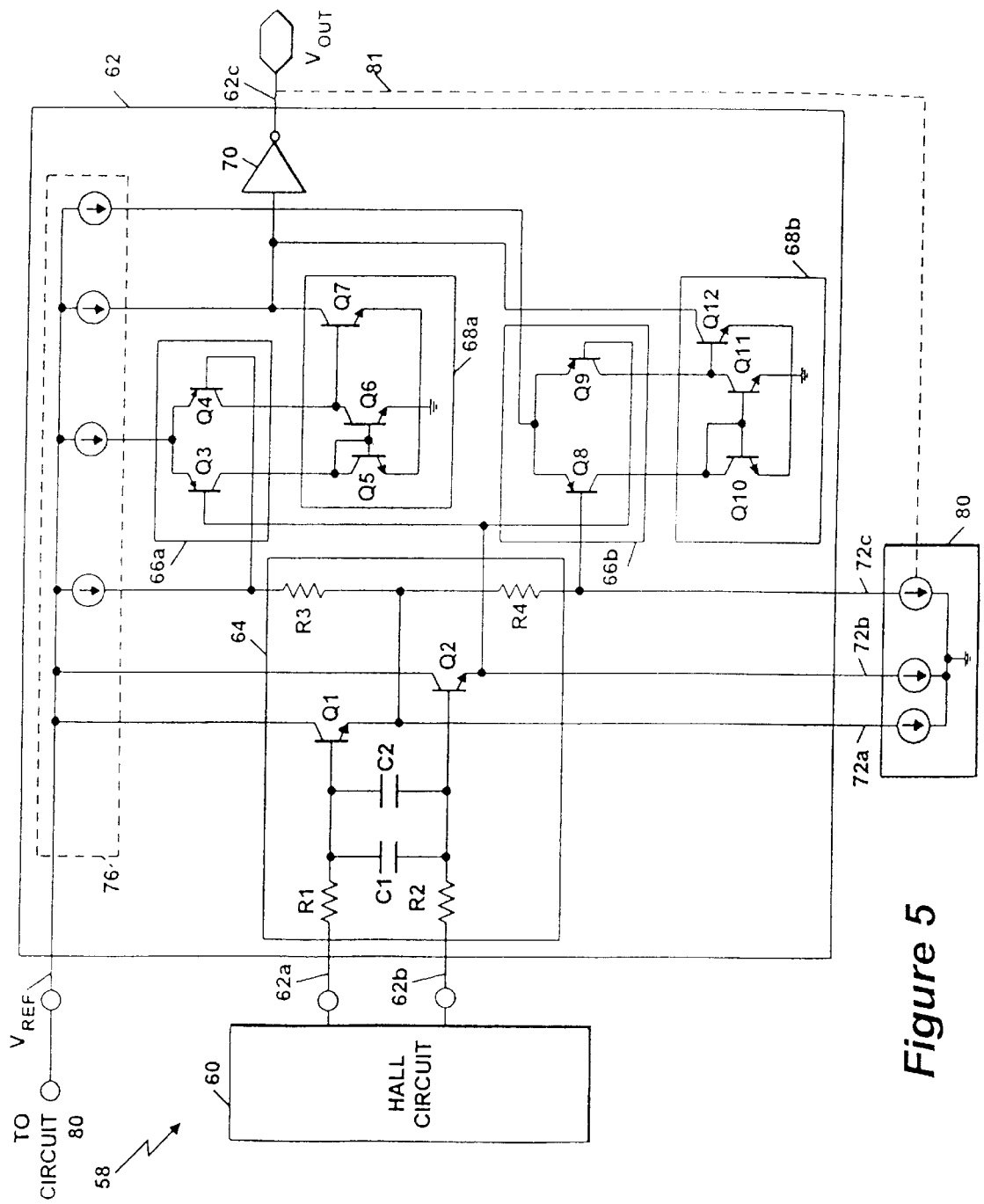
FIG. 5 is a schematic diagram of a switch circuit including a magnetic-field-to-voltage transducer.

Referring now to FIG. 5, a switch circuit 58 includes a magnetic-field-to-voltage transducer provided from a Hall element circuit 60 and a comparator 62. In this particular embodiment, the Hall element circuit 60 has a pair of outputs connected differentially to a pair of input terminals 62a, 62b of a window comparator 62.

The Hall element 60 is mounted such that the Hall voltage increases or decreases based upon the proximity of a magnet (not shown) to the Hall element 60. Alternatively, the detector circuit of FIG. 4 may be used to detect articles that themselves are magnetized.

The Hall voltage signal is manipulated by the window comparator circuitry 62 to produce an output signal $V_{OUT}$ which provides an indication of whether any magnetic particle is within a predetermined distance of the Hall element 60.

The differential input signal is coupled through a filter and level shifter circuit 64. It should be appreciated that in an alternative embodiment the filter and level shifter circuit 64 could be provided as part of the Hall element circuit 60 rather than as part of the comparator circuit 62. The appropriately filtered and level shifted signals are coupled from the filter and level shifter circuit 64 to respective ones of differential pair circuits 66a, 66b.

Each of the differential pair circuits 66a or 66b, are provided to accept signals generated by the interaction of Hall circuit 60 with a respective one of the north or south poles of a magnet. As shown in Table II, the relationship of the magnet polarity to the Hall effect device (i.e. the orientation of the north and south magnet poles with respect to the Hall device) determines the output values provided by each the two differential pair circuits.

The output signals provided by the differential pair circuits 66a, 66b are fed to respective ones of output amplifier stages 68a, 68b generally denoted 68. The output amplifier stages 68 convert the differential voltage provided from differential pair circuits 66a, 66b into a single ended voltage which drives the inverter the inverter circuit 70. Those of ordinary skill in the art appreciate, however, that inverter circuits can be driven with single or differential lines. Those of ordinary skill in the art will also appreciate when it is preferable to drive an inverter circuit with differential lines rather than a single line.

The signals are then fed to an output/buffer amplifier stage 70 which is coupled to the output port 62c of the comparator 62. Comparator circuit 62 also includes a circuit 76 which includes a plurality of current sources which provide control signals to differential pair circuits 66a, 66b and to buffer circuit 68a, 68b.

A temperature and voltage compensation circuit 80 includes a plurality of current sinks 72a–72c which allow the comparator 62 to operate properly while withstanding a relatively wide range of voltage and temperature changes.

This is particularly important in devices, such as cell phones for example, in which the normal operating voltage of the device is relatively low (to conserve battery power and to operate in a power conservation mode, for example). Such low normal operating voltages combined with varying temperature ranges and variations due to standard manufacturing processes used to fabricate circuits, makes it relatively difficult to maintain switch points of comparator 62. To overcome difficulties, a comparator bias circuit 80 allows the comparator 62 to withstand low voltages which change by plus and minus 20%. To maintain the switch points of comparator 62 fixed over this relatively wide range of voltages, the comparator bias circuit 80 provides compensation signals to comparator 62 to allow the comparator 62 to operate over a wide range of voltage, temperature and process variations.

The dash line 81 between the current source 72c and the output terminal 62c indicates that the output controls the current source 72c. A first output level causes current source 72c to produce a relatively low current and a second different output level causes signal source 72c to produce a relatively high current.

As discussed above in conjunction with FIGS. 3 and 3A and as implemented in the circuit of FIG. 5, if an input voltage from the Hall circuit 60 is equal to zero volts and is increasing in a positive direction, then the output voltage $V_{OUT}$ switches once the voltage level reaches and/or exceeds the threshold voltage $V_{TH+}$ thereby causing the output voltage $V_{OUT}$ to go low (i.e. assume a voltage level of $V_{LOW}$). Depending upon whether the output voltage $V_{OUT}$ is high or low, a differential voltage drop exists across one of the resistors R3 or R4 which are coupled to source 72c. Thus, controlling the current source 72c changes the value which causes the differential voltage drop across either resistor R3 or R4 and causes the switch point to be changed from $V_{TH+}$ to $V_{TH-}$ or vice-versa (and similarly causes the switch points to be changed from $-V_{TL+}$ to $-V_{TL-}$).

Table II below shows the output signal value $V_{OUT}$ and the operation of the differential pair comparator circuits 66a, 66b with respect to the magnetic field characteristics.

TABLE II

| MAGNETIC FIELD | | | | | |
|---|---|---|---|---|---|
| RELATIVE STRENGTH | $V_{IN}$ POLARITY | DIFF. PAIR #1 | DIFF. PAIR #2 | COMP. OUTPUT | $V_{OUT}$ |
| STRONG SOUTH | POSITIVE | ON | OFF | LOW | LOW |
| WEAK SOUTH | POSITIVE | OFF | OFF | HIGH | HIGH |
| WEAK NORTH | NEGATIVE | OFF | OFF | HIGH | HIGH |

TABLE II-continued

| MAGNETIC FIELD | | | | | |
|---|---|---|---|---|---|
| RELATIVE STRENGTH | $V_{IN}$ POLARITY | DIFF. PAIR #1 | DIFF. PAIR #2 | COMP. OUTPUT | $V_{OUT}$ |
| STRONG NORTH | NEGATIVE | OFF | ON | LOW | LOW |

As noted above the comparator 62 is symmetrical and thus (as illustrated in FIG. 3A) there is the same switching point for positive and negative magnetic fields.

The symmetrical comparator 62 of the present invention provides several advantages including: similar operation for both polarities of a magnet and operation which is independent of power supply voltage.

The comparator 62 and the bias circuit 80 may be implemented as a single integrated circuit to thus provide a relatively compact semiconductor switch circuit which is magnetic pole insensitive.

Having described preferred embodiments of the invention, one of ordinary skill in the art will now realize further features and advantages of the invention from the above-described embodiments. It should be understood, therefore, that the foregoing is only illustrative of the principles of the invention and that various modifications can be made by those skilled in the art without departing from the scope and spirit of the invention. Accordingly, the invention is not to be limited by what has been particularly shown and described, except as indicated by the appended claims.

What is claimed is:

1. A switching system for providing a signal in response to an article which provides a magnetic field, the switching system comprising:
   (a) a sensor for sensing the magnetic field of the magnetic article, said sensor for generating a first signal voltage having a signal voltage level which is proportional to a magnetic field having a first polarity and a second signal voltage having a signal voltage level that is proportional to a magnetic field having a second different polarity; and
   (b) a threshold detection circuit coupled to the sensor to receive the first and second signal voltages and responsive to a supply voltage to provide an output signal having a first value when said magnetic article is within a predetermined distance of the sensor regardless of the polarity of the magnetic field, said threshold detection circuit comprising a first circuit for comparing said first signal voltage to a first threshold level and a second circuit for comparing said second signal voltage to a second threshold level, wherein said first and second threshold levels are substantially constant in response to variations in said supply voltage.

2. The switching system of claim 1 wherein:
   said sensor is a magnetic-field-to-voltage transducer for generating a first signal voltage having a signal voltage level which is proportional to a magnetic field having a first polarity and a second signal voltage having a signal voltage level that is proportional to a magnetic field having a second different polarity; and
   said threshold detection circuit is coupled to said magnetic-field-to-voltage transducer to receive the first and second signal voltages and to provide an output signal having a first value when the article is within the predetermined distance of said magnetic-field-to-voltage transducer regardless of the polarity of the magnetic field with respect to said magnetic-field-to-voltage transducer.

3. The switching system of claim 2 wherein:
   said magnetic-field-to-voltage transducer is a Hall element circuit; and
   said threshold detection circuit is a comparator coupled to said Hall element circuit.

4. The switching system of claim 3 wherein said comparator is a window comparator comprising first and second differential pair circuits, each of said first and second differential pair circuits having an input terminal coupled to one of a pair of outputs from said Hall element circuit and an output terminal coupled to an output terminal of said comparator.

5. The switching system of claim 4 further comprising a filter and level shifter circuit coupled between said Hall element circuit and said comparator.

6. The switching system of claim 4 further comprising first and second output amplifier stages, each of the output amplifier stages coupled between a respective one of the output terminals of the first and second differential pair circuits and the output terminal of said comparator.

7. The switching system of claim 6 further comprising an output/buffer amplifier stage having an input terminal coupled to the output terminal of each of said first and second output amplifier stages and having an output terminal coupled to the output terminal of said comparator.

8. The switching system of claim 1 further comprising a temperature and voltage bias circuit coupled to said comparator, said temperature and voltage bias circuit for maintaining operating signals in said threshold detection circuit within a predetermined range of operating signal levels in response to changes in supply voltage and operating temperature.

9. A method of switching comprising the steps of:
   (a) sensing with a magnetic field sensing element a magnetic field provided by a magnetic article having a first pole region on a first substantially flat surface and a second pole region on said first surface wherein said magnetic article has first magnetic field polarity at the first pole region and a second different magnetic field polarity at the second pole region;
   (b) generating a sensor output signal having a signal level which is proportional to the magnetic field sensed in step (a), wherein the sensor output signal has a first signal direction when the first pole region is proximate said magnetic field sensing element and a second opposite signal direction when the second pole region is proximate said magnetic field sensing element;
   (c) comparing the sensor output signal to at least one of first and second threshold signal levels; and
   (d) in response to the sensor output signal level reaching or exceeding the one of the first and second threshold signal levels, providing an output signal having the same signal level when the sensor output signal has the first signal direction as when the sensor output signal has the opposite signal direction.

10. The method of claim 9 further comprising the step of:
    (e) in response to the sensor output signal having a first signal level which is less than the one of the first and second threshold signal levels, providing an output signal having a second different signal level regardless of the direction of the sensor output signal.

11. The method of claim 10 wherein, in response to the output signal changing from the first signal level to the second different signal level the method further comprises the steps of changing a switch point of a threshold circuit from a first predetermined threshold level to a second predetermined threshold level.

12. The method of claim 11 wherein the absolute value of the first predetermined threshold level is greater than the absolute value of the second predetermined threshold level.

13. A device comprising any device or apparatus which uses a magnetic device in conjunction with a movable portion:

a base;

an element movably coupled to said base;

a magnetic article disposed in a selected one of said base and said element; and a switch disposed in the other one of said base and said element, said switch comprising:

a sensor for sensing the magnetic field of the magnetic article and for generating a first signal having a signal level proportional to a magnetic field of a first polarity and a second signal having an opposite signal level proportional to a magnetic field of a second different polarity; and a comparator coupled to the sensor to receive the first and second signals and to provide an output signal having the same value when said magnetic article is within a predetermined distance of the sensor and the magnetic field of the magnetic article has the first polarity as when the magnetic article is within a predetermined distance of the sensor and the magnetic field of the magnetic article has the second different polarity.

* * * * *

UNITED STATES PATENT AND TRADEMARK OFFICE
CERTIFICATE OF CORRECTION

PATENT NO.    : 6,622,012 B2
DATED         : September 16, 2003
INVENTOR(S)   : Alberto Bilotti et al.

It is certified that error appears in the above-identified patent and that said Letters Patent is hereby corrected as shown below:

Column 1,
Line 51, reads "a magnetic" and should read -- of a magnetic --.
Line 64, reads "not physical" and should read -- not a physical --.

Column 2,
Line 2, reads "as a solid" and should read -- as solid --.
Line 13, reads "hall" should read -- Hall --.
Line 53, reads "trans ducer" should read -- transducer --.

Column 3,
Line 38, reads "maybe" should read -- may be --.

Column 4,
Line 55, reads "18 Thus" should read -- 18. Thus --.

Column 5,
Line 26, reads "vice-versa" should read -- vice versa --.

Column 7,
Line 23, reads "that column" should read -- that the column --.

Column 8,
Line 50, reads "vice-versa" should read -- vice versa --.

Column 11,
Line 11, reads "abase;" should read -- a base --.

Signed and Sealed this

Eleventh Day of November, 2003

JAMES E. ROGAN
*Director of the United States Patent and Trademark Office*